US012633248B2

(12) United States Patent
Kim et al.

(10) Patent No.: US 12,633,248 B2
(45) Date of Patent: May 19, 2026

(54) DISPLAY MODULE

(71) Applicant: SAMSUNG ELECTRONICS CO., LTD., Suwon-si (KR)

(72) Inventors: Jinho Kim, Suwon-si (KR); Donggun Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 114 days.

(21) Appl. No.: 17/972,202

(22) Filed: Oct. 24, 2022

(65) Prior Publication Data

US 2023/0117897 A1 Apr. 20, 2023

Related U.S. Application Data

(63) Continuation of application No. PCT/KR2021/005019, filed on Apr. 21, 2021.

(30) Foreign Application Priority Data

Apr. 24, 2020 (KR) ........................ 10-2020-0050283
Nov. 3, 2020 (KR) ........................ 10-2020-0145523

(51) Int. Cl.
*G09G 3/32* (2016.01)
*H10D 86/40* (2025.01)
(Continued)

(52) U.S. Cl.
CPC .............. *G09G 3/32* (2013.01); *H10D 86/451* (2025.01); *H10D 86/60* (2025.01); *H10W 90/00* (2026.01);
(Continued)

(58) Field of Classification Search
CPC .................................................. G09G 2310/08
See application file for complete search history.

(56) References Cited

U.S. PATENT DOCUMENTS 7,808,497 B2 10/2010 Lo et al.
8,416,157 B2 4/2013 Lee et al.
(Continued)

FOREIGN PATENT DOCUMENTS

EP 3 735 685 12/2019
JP 2003-76346 A 3/2003
(Continued)

OTHER PUBLICATIONS

Communication dated Aug. 17, 2021, issued by the International Searching Authority in counterpart International Application No. PCT/KR2021/005019 (PCT/ISA/210 and PCT/ISA/237).
(Continued)

*Primary Examiner* — William Boddie
*Assistant Examiner* — Alecia D English
(74) *Attorney, Agent, or Firm* — Sughrue Mion, PLLC

(57) ABSTRACT

A display module is disclosed. The present display module comprises: a driving circuit layer provided on a substrate and comprising first driving circuits and second driving circuits; and a pixel array provided on the driving circuit layer and having pixels arranged in a matrix, the pixels each including a plurality of inorganic light-emitting devices, wherein: the first driving circuits provided for each pixel drive the plurality of inorganic light-emitting devices included in each pixel on the basis of data voltages applied through data lines; the second driving circuits generate control signals for driving the first driving circuits on the basis of clock signals applied through clock lines and provide same to the first driving circuits; the driving circuit layer comprises a first metal layer, a second metal layer, and at least one third metal layer; and the clock signals are applied from the clock lines to the second driving circuits through jumping lines formed in one of the at least one third metal layer.

8 Claims, 11 Drawing Sheets

(51) Int. Cl.
    *H10D 86/60*        (2025.01)
    *H10W 90/00*      (2026.01)

(52) U.S. Cl.
    CPC . *G09G 2300/0426* (2013.01); *G09G 2310/08*
      (2013.01); *G09G 2320/0626* (2013.01); *H10D*
                           *86/441* (2025.01)

(56)                References Cited

U.S. PATENT DOCUMENTS

| | | | |
|---|---|---|---|
| 9,379,137 | B2 | 6/2016 | Kim et al. |
| 9,401,120 | B2 | 7/2016 | Xiao |
| 9,632,611 | B1 | 4/2017 | Xiao et al. |
| 9,697,786 | B2 | 7/2017 | Lee et al. |
| 10,102,793 | B2 | 10/2018 | Jang et al. |
| 10,199,447 | B2 | 2/2019 | Jeong et al. |
| 10,706,766 | B2 | 7/2020 | Kim et al. |
| 10,713,996 | B2 | 7/2020 | Kim et al. |
| 10,877,276 | B1* | 12/2020 | Pappas ................. G06F 3/0346 |
| 10,930,231 | B2 | 2/2021 | Kim et al. |
| 11,011,127 | B2 | 5/2021 | Kim |
| 11,210,995 | B2 | 12/2021 | Kim et al. |
| 11,398,181 | B2 | 7/2022 | Kim et al. |
| 2017/0069260 | A1* | 3/2017 | Cho ...................... G09G 3/2022 |
| 2017/0193893 | A1* | 7/2017 | Lee ...................... H10D 86/471 |
| 2017/0205934 | A1* | 7/2017 | Lee ...................... H10D 86/441 |
| 2017/0263183 | A1 | 9/2017 | Lin et al. |
| 2017/0345845 | A1* | 11/2017 | Wu ....................... G02F 1/1345 |
| 2019/0237489 | A1* | 8/2019 | Matsukizono ...... H01L 27/1248 |
| 2020/0355954 | A1* | 11/2020 | Yu ......................... G06F 3/0443 |
| 2021/0210002 | A1 | 7/2021 | Kim et al. |
| 2021/0356785 | A1* | 11/2021 | Yuan ................... G09G 3/3685 |
| 2021/0366362 | A1* | 11/2021 | Xuan ................... G09G 3/3233 |
| 2023/0119969 | A1* | 4/2023 | Lv ...................... G02F 1/136286 |
| | | | 349/56 |

FOREIGN PATENT DOCUMENTS

| | | |
|---|---|---|
| JP | 2008-216961 A | 9/2008 |
| KR | 10-2009-0072548 A | 7/2009 |
| KR | 10-2015-0044514 A | 4/2015 |
| KR | 10-2017-0003185 A | 1/2017 |
| KR | 10-2018-0062515 A | 6/2018 |
| KR | 10-2018-0079106 A | 7/2018 |
| KR | 10-2019-0043799 A | 4/2019 |
| KR | 10-2019-0074022 A | 6/2019 |
| KR | 10-2019-0078180 A | 7/2019 |
| KR | 10-2033619 B1 | 10/2019 |
| KR | 10-2019-0137658 A | 12/2019 |
| KR | 10-2089074 B1 | 3/2020 |
| KR | 10-2020-0038741 A | 4/2020 |

OTHER PUBLICATIONS

Office Action issued Sep. 25, 2025 by the Korean Patent Office for KR Patent Application No. 10- 2020-0145523.

\* cited by examiner

FIG. 5A

| | |
|---|---|
| VDD OR VSS/ PIXEL ELECTRODE | ◄——— M4 |
| VDD or VSS | ◄——— M3 |
| SOURCE/DRAIN | ◄——— M2 |
| GATE | ◄——— M1 |

FIG. 5B

| | |
|---|---|
| VDD_PWM/ SWEEP VOLTAGE ELECTRODE/PIXEL ELECTRODE | ◄——M5 |
| VDD_PAM or VSS | ◄——M4 |
| VDD_PAM or VSS | ◄——M3 |
| SOURCE/DRAIN | ◄——M2 |
| GATE | ◄——M1 |

DISPLAY MODULE

CROSS-REFERENCE TO RELATED APPLICATIONS

This application is a bypass continuation application of International Application No. PCT/KR2021/005019, filed on Apr. 21, 2021, which claims priority to Korean Patent Application Nos. 10-2020-0050283 and 10-2020-0145523, filed on Apr. 24, 2020 and Nov. 3, 2020, respectively, in the Korean Intellectual Property Office, the disclosures of which are incorporated by reference herein in their entireties.

BACKGROUND

1. Field

The disclosure relates to a display module, and more particularly, to a display apparatus including a pixel array consisting of self-emitting devices.

2. Related Art

A display module that drives inorganic light-emitting devices constituting a sub-pixel in an active matrix (AM) method includes a driving circuit (hereinafter, referred to as a first driving circuit) for each sub-pixel to provide a driving current corresponding to a data voltage to each sub-pixel. Also, the display module includes a driving circuit (hereinafter, referred to as a second driving circuit) for controlling an operation of the first driving circuit by providing a control signal.

In the case of a conventional display module, the first driving circuit was arranged in an active area wherein a pixel array is arranged and an image is displayed, and the second driving circuit was arranged in a non-active area (e.g., a bezel area) wherein an image is not displayed.

However, the presence of such a bezel area wherein the second driving circuit is arranged becomes a restriction in the aspect of design of a display apparatus including a display module, and in particular, in the case of constituting a large area display panel by coupling a plurality of display modules, there is a problem that it is difficult to provide a seamless image due to bezels present in the coupling portions.

One purpose of the disclosure is in providing a bezel-less display module.

Another purpose of the disclosure is in providing a display module including driving circuits that can stably drive inorganic light-emitting devices.

Still another purpose of the disclosure is in providing a display module that provides improved color reproducibility for an input image signal through inorganic light-emitting devices.

SUMMARY

A display module according to an embodiment of the disclosure for achieving the aforementioned purpose includes a substrate; a driving circuit layer formed on the substrate, the driving circuit layer including first driving circuits and second driving circuits; and a pixel array, including a plurality of pixels, formed on the driving circuit layer, each pixel including a plurality of inorganic light-emitting devices, the plurality of pixels being arranged in a matrix form, wherein a first driving circuit from among the first driving circuits is provided for each pixel, and the first driving circuits drive the plurality of inorganic light-emitting devices included in each pixel based on data voltages applied through data lines, wherein the second driving circuits generate control signals for driving the first driving circuits based on clock signals applied through clock lines, and provide the generated control signals to the first driving circuits, wherein the first driving circuits and the second driving circuits include a plurality of thin film transistors (TFTs), and wherein the driving circuit layer includes: a first metal layer at which gate electrodes of the plurality of TFTs are formed; a second metal layer at which source electrodes and drain electrodes of the clock lines, the data lines, and the plurality of TFTs are formed; and at least one third metal layer at which electrodes that provide voltages for driving the first driving circuits are formed, and the clock signals are applied from the clock lines to the second driving circuits through jumping lines formed in the at least one third metal layer.

Also, the plurality of pixels of the pixel array may be arranged in the matrix form at predetermined intervals from one another, wherein the first driving circuits may be respectively formed in areas corresponding to the plurality of respective pixels, wherein the clock lines may be arranged in a direction of the data lines in an area between the first driving circuits corresponding to a first column line in the matrix form and the first driving circuits corresponding to a second column line adjacent to the first column line, wherein the second driving circuits may be arranged in an area opposite to the area where the clock lines may be arranged based on the first driving circuits corresponding to the first column line or the second column line, and wherein the data lines may be arranged in an area between the clock lines and the second driving circuits.

In addition, the second driving circuits may provide the control signals to the first driving circuits for driving the plurality of inorganic light-emitting devices corresponding to row lines in the matrix form.

Further, the driving circuit layer may have a stack structure in an order of the first metal layer, the second metal layer, and the at least one third metal layer.

Also, the voltage for driving may be one of a driving voltage and a ground voltage, wherein the jumping lines may be formed in one of two third metal layers, and wherein on one of the two third metal layers, an electrode for providing the driving voltage is formed, and on the other one of the two third metal layers, an electrode for providing the ground voltage is formed.

In addition, the voltage for driving may be one of a first driving voltage, a second driving voltage, and a ground voltage, wherein the jumping lines may be formed in one of three third metal layers, and wherein on a first of the three third metal layers, an electrode for providing the first driving voltage is formed, and on a second of the three third metal layers, an electrode for providing the second driving voltage is formed, and on a third of the three third metal layers, an electrode for providing the ground voltage is formed.

Further, the first driving circuits may respectively include a pulse width modulation (PWM) circuit including a driving transistor, wherein the PWM circuit changes a voltage of a gate terminal of the driving transistor according to an applied sweep voltage, and provides a driving current of a pulse width corresponding to a data voltage to the plurality of inorganic light-emitting devices, and one of the three third metal layers may further include a sweep electrode for applying the sweep voltage.

Also, the driving circuit layer may further include an inorganic insulator formed between the first metal layer and the second metal layer; and an organic insulator formed between the second metal layer and the at least one third metal layer; and a thickness of the organic insulator is greater than a thickness of the inorganic insulator.

BRIEF DESCRIPTION OF DRAWINGS

FIG. 5A is a diagram illustrating a stack structure of a metal layer according to an embodiment of the disclosure;

FIG. 5B is a diagram illustrating a stack structure of a metal layer according to another embodiment of the disclosure;

DETAILED DESCRIPTION

According to the various embodiments of the disclosure as described above, a bezel-less display module can be provided. Also, design of an optimized driving circuit is possible, and inorganic light-emitting devices can be driven stably. In addition, a display module having improved color reproducibility can be provided. Further, the disclosure can contribute to miniaturization and weight lightening of a display panel.

In describing the disclosure, in case it is determined that detailed explanation of related known technologies may unnecessarily confuse the gist of the disclosure, the detailed explanation will be omitted. Also, overlapping explanation of the same components will be omitted as much as possible.

The suffix "part" for components used in the following description is provided or interchangeably used in consideration of only easiness of drafting the specification, and does not have meaning or a function of itself distinguishing it from other components.

The terms used in the disclosure are used only to explain the embodiments, and are not intended to restrict and/or limit the disclosure. Also, singular expressions include plural expressions, unless defined obviously differently in the context.

In the disclosure, terms such as 'include' and 'have' should be construed as designating that there are such characteristics, numbers, steps, operations, elements, components or a combination thereof described in the specification, but not as excluding in advance the existence or possibility of adding one or more of other characteristics, numbers, steps, operations, elements, components or a combination thereof.

The expressions "first," "second," and the like used in the disclosure may be used to describe various elements regardless of any order and/or degree of importance. Also, such expressions are used only to distinguish one element from another element, and are not intended to limit the elements.

The description in the disclosure that one element (e.g.: a first element) is "(operatively or communicatively) coupled with/to" or "connected to" another element (e.g.: a second element) should be interpreted to include both the case where the one element is directly coupled to the another element, and the case where the one element is coupled to the another element through still another element (e.g.: a third element). In contrast, the description that one element (e.g.: a first element) is "directly coupled" or "directly connected" to another element (e.g.: a second element) can be interpreted to mean that still another element (e.g.: a third element) does not exist between the one element and the another element.

The terms used in the embodiments of the disclosure may be interpreted as meanings generally known to those of ordinary skill in the art described in the disclosure, unless defined differently in the disclosure.

Hereinafter, various embodiments of the disclosure will be described in detail with reference to the accompanying drawings.

Figure 1:
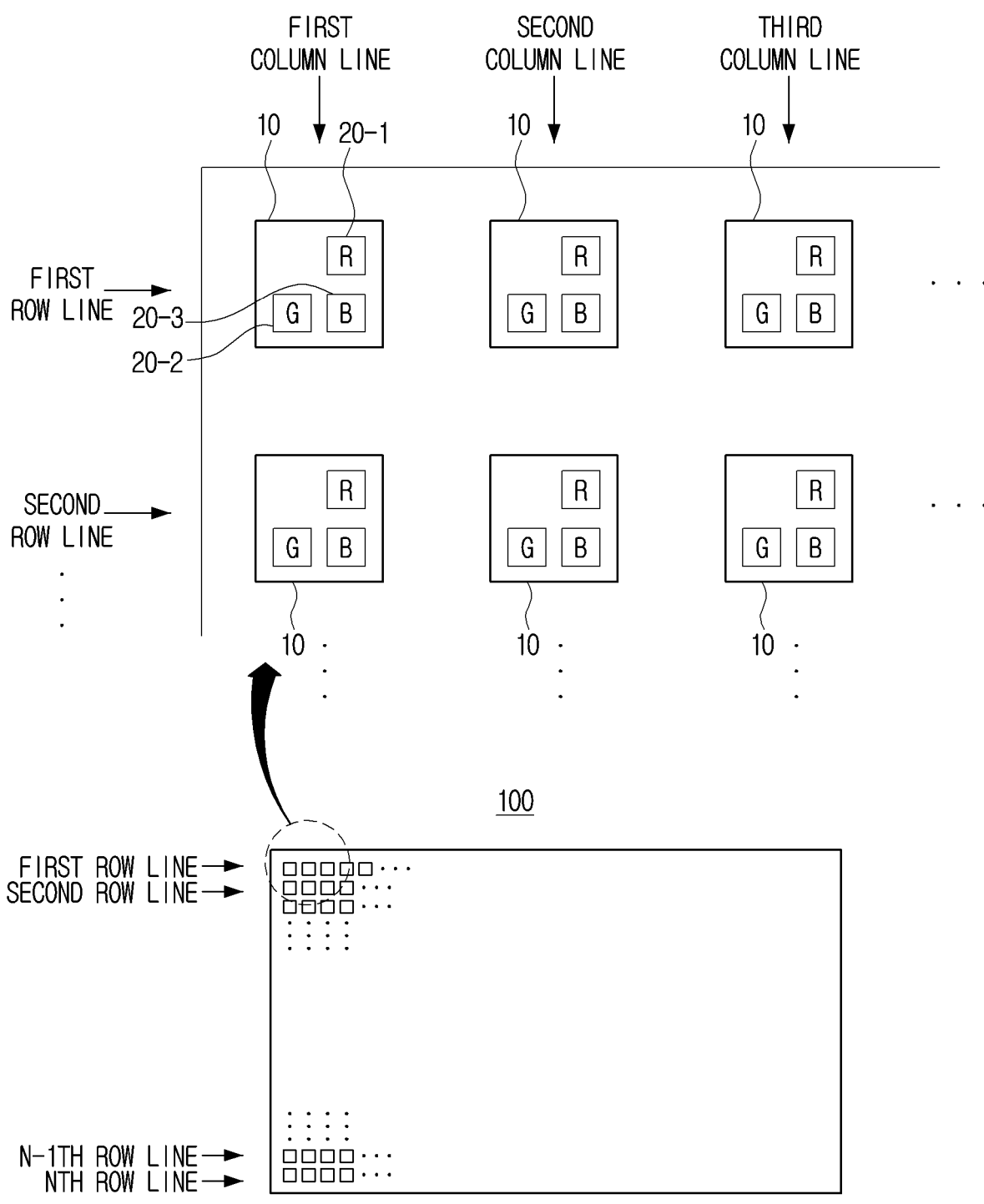
FIG. 1 is a diagram for illustrating a pixel structure of a display module according to an embodiment of the disclosure.

FIG. 1 is a diagram for illustrating a pixel structure of a display module according to an embodiment of the disclosure.

Referring to FIG. 1, a display module 100 includes a plurality of pixels 10 disposed (or arranged) in a matrix form, i.e., a pixel array.

The pixel array includes a plurality of row lines or a plurality of column lines. Depending on cases, a row line may also be referred to as a horizontal line, and a column line may also be referred to as a vertical line.

Meanwhile, each pixel 10 of the pixel array may include three kinds of sub-pixels such as a red (R) sub-pixel 20-1, a green (G) sub-pixel 20-2, and a blue (B) sub-pixel 20-3.

Here, each pixel 10 may include a plurality of inorganic light-emitting devices constituting the sub-pixels 20-1, 20-2, 20-3 of the pixel.

For example, each pixel 10 may include three kinds of inorganic light-emitting devices such as an R inorganic light-emitting device corresponding to the R sub-pixel 20-1, a G inorganic light-emitting device corresponding to the G sub-pixel 20-2, and a B inorganic light-emitting device corresponding to the B sub-pixel 20-3.

Alternatively, each pixel 10 may include three blue inorganic light-emitting devices. In this case, on each inorganic light-emitting device, a color filter for implementing R, G, and B colors may be provided. Here, the color filter may be a quantum dot (QD) color filter, but is not limited thereto.

Here, an inorganic light-emitting device refers to a light-emitting device manufactured by using an inorganic material, which is different from an organic light emitting diode (OLED) manufactured by using an organic material.

In particular, according to an embodiment of the disclosure, an inorganic light-emitting device may be a micro light emitting diode (μ-LED) having a size smaller than or equal to 100 micrometers (m). In this case, the display module 100 becomes a micro LED display module wherein each sub-pixel is implemented as a micro LED.

A micro LED display module consists of a plurality of inorganic light emitting diodes (inorganic LEDs) each of which is smaller than or equal to 100 micrometers.

A micro LED display module provides better contrast, response time, and energy efficiency than a liquid crystal display (LCD) panel which needs a backlight. Meanwhile, both of an organic light emitting diode (organic LED, OLED) and a micro LED have good energy efficiency, but a micro LED provides better performance than an OLED in the aspects of brightness, light emitting efficiency, and a lifespan.

In particular, a micro LED has a characteristic that its efficiency becomes better when using a relatively higher current than an OLED. Thus, the micro LED display module 100 may provide a driving voltage to the first driving circuit through a separate metal layer from a metal layer on which a gate electrode of a thin film transistor (TFT) or a source or drain electrode is formed as will be described below, for providing a stable high current.

However, in the various embodiments of the disclosure, an inorganic light-emitting device is not necessarily limited to a micro LED.

Meanwhile, although not illustrated in the drawing, in each sub-pixel 20-1, 20-2, 20-3, a first driving circuit for driving inorganic light-emitting devices constituting the sub-pixel based on a data voltage applied through a data line may be provided. As the first driving circuit is provided for each sub-pixel, it may also be referred to as a sub-pixel circuit in other words.

Also, according to an embodiment of the disclosure, in an area between the areas occupied by each pixel 10 in the display module 100, a second driving circuit for generating a control signal for driving the first driving circuit, and providing the generated control signal to the first driving circuit may be provided. Here, the second driving circuit may be, for example, a gate driver circuit (or a scan driver circuit).

As described above, according to an embodiment of the disclosure, within an active area of the display module 100 wherein the pixel array is arranged and an image is displayed, the second driving circuit is provided together with the first driving circuit, and thus implementation of a display module without a bezel becomes possible.

Meanwhile, in FIG. 1, it can be seen that the sub-pixels 20-1 to 20-3 are arranged in a shape of L of which left and right sides are reversed within one pixel 10. However, the illustrated arrangement form of the sub-pixels 20-1 to 20-3 is merely an example, and the sub-pixels may be arranged in various forms within the pixel 10 depending on embodiments.

Also, in the aforementioned embodiment, an example wherein a pixel consists of three kinds of sub-pixels such as R, G, and B is suggested, but the disclosure is not limited thereto. For example, a pixel may consist of four kinds of sub-pixels such as R, G, B, and white (W).

In this case, as the W sub-pixel is used in expressing luminance of the pixel, power consumption can be reduced compared to a pixel consisting of three kinds of sub-pixels such as R, G, and B. Hereinafter, for the convenience of explanation, explanation will be made based on an example wherein the pixel 10 consists of three kinds of sub-pixels such as R, G, and B.

Figure 2:
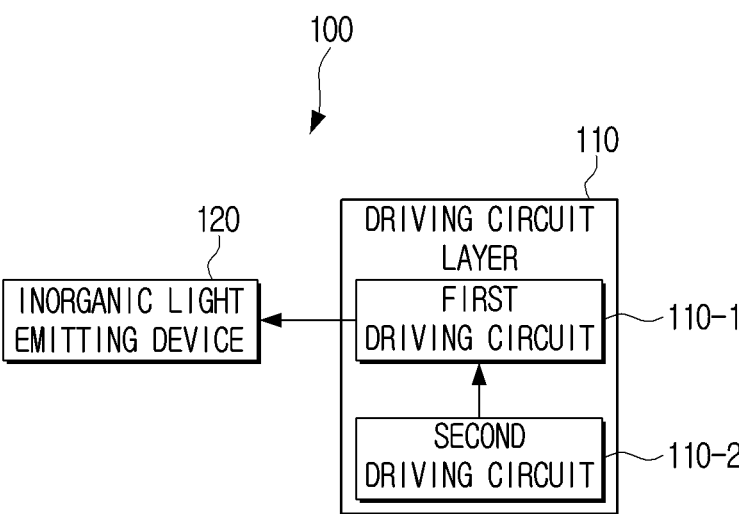
FIG. 2 is a block diagram of a display module according to an embodiment of the disclosure.

FIG. 2 is a block diagram of a display module according to an embodiment of the disclosure. According to FIG. 2, the display module 100 includes a driving circuit layer 110 and inorganic light-emitting devices 120.

Here, the display module 100 may have a structure wherein the driving circuit layer 110 is formed on a substrate, and the inorganic light-emitting devices 120 are arranged on the driving circuit layer 110, as will be described below.

The inorganic light-emitting devices 120 constitute the sub-pixels 20-1 to 20-3 of the display module 100, and emit light according to a driving current provided from the first driving circuit 110-1 included in the driving circuit layer 110.

The driving circuit layer 110 includes various kinds of circuits for driving the inorganic light-emitting devices 120. In particular, the driving circuit layer 110 may include the first driving circuit 110-1 for driving the inorganic light-emitting devices 120, and the second driving circuit 110-2 for driving the first driving circuit 110-1.

The first driving circuit 110-1 provides a driving current to the inorganic light-emitting devices 120. Specifically, the first driving circuit 110-1 may provide a driving current of which size and driving time are controlled to the inorganic light-emitting devices 120, based on a data voltage, a driving voltage, and various kinds of control signals applied from the second driving circuit 110-2.

That is, the first driving circuit 110-1 may drive the inorganic light-emitting devices 120 by a pulse amplitude modulation (PAM) method and/or a pulse width modulation (PWM) method, and control the brightness of light emitted by the inorganic light-emitting devices 120.

For this, the first driving circuit 110-1 may include a PAM circuit for providing a driving current of a size corresponding to a PAM data voltage to the inorganic light-emitting devices 120 and/or a PWM circuit for providing a driving current provided from the PAM circuit to the inorganic light-emitting devices 120 during a time corresponding to a PWM data voltage.

In particular, in the case of driving the inorganic light-emitting devices 120 by the PWM driving method, various gray scales may be expressed by varying the driving time of the driving current even if the magnitude of the driving current is the same. Accordingly, the problem that the wavelength of light emitted by the inorganic light-emitting devices changes according to the magnitude of the driving current can be resolved, and thus better color reproducibility can be implemented.

The second driving circuit 110-2 is a driving circuit for driving the first driving circuit 110-1. That is, the second driving circuit 110-2 may generate a control signal for the operation of the first driving circuit 110-1, and provide the signal to the first driving circuit 110-1.

Specifically, the second driving circuit 110-2 may receive input of a plurality of clock signals and a control signal (e.g., a reset signal, a start signal, etc.) for controlling the operation of the second driving circuit 110-2 and generate a control signal for controlling the operation of the first driving circuit 110-1, and provide the generated control signal to the first driving circuit 110-1.

For example, the second driving circuit 110-2 may generate various kinds of control signals for driving the pixel array of the display module 100 wherein pixels are arranged in a matrix form in units of row lines, and provide the control signals to the first driving circuit 110-1.

In the various embodiments of the disclosure, the second driving circuit 110-2 may refer to at least a portion of the gate driver (or the scan driver) for driving the plurality of pixels (or sub-pixels) in units of row lines, and may sequentially drive the first driving circuits 110-1 of the sub-pixels constituting each pixel of the pixel array for each row line.

Figure 3A:
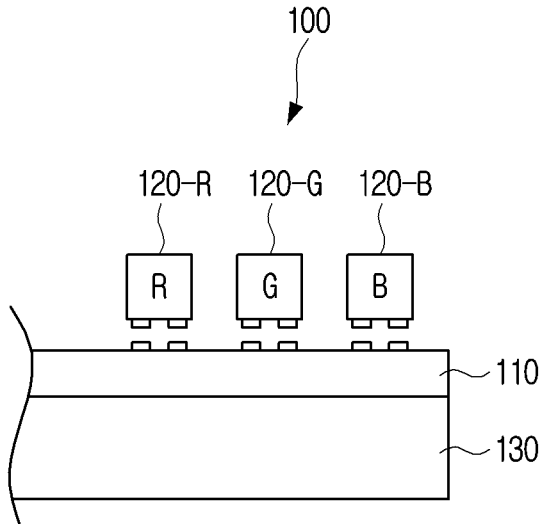
FIG. 3A is a cross-sectional view of a display module according to an embodiment of the disclosure.

FIG. 3A is a cross-sectional view of a display module according to an embodiment of the disclosure. In FIG. 3A, for the convenience of explanation, only one pixel included in the display module 100 was illustrated.

According to FIG. 3A, the driving circuit layer 110 is formed on the substrate 130, and each of the inorganic light-emitting devices R, G, B (120-R, 120-G, 120-B) is arranged on the driving circuit layer 110, and constitutes each sub-pixel of the display module 100.

Here, according to an embodiment of the disclosure, the substrate 130 may be implemented as glass, but is not limited thereto.

The driving circuit layer 110 may be formed on the substrate 130, and may be implemented as a thin film transistor (TFT) and constitute a TFT layer. Accordingly, the first driving circuit 110-1 and the second driving circuit 110-2 implemented to include a plurality of TFTs may be included in the driving circuit layer 110.

As described above, a structure wherein the second driving circuit 110-2 for driving the first driving circuit 110-1 is formed inside the TFT layer may be referred to as a gate in panel (GIP) structure, but the name is not limited thereto.

Although not illustrated to be clearly distinguished in the drawing, in the driving circuit layer 110, the first driving circuit 110-1 for driving each inorganic light-emitting device 120-R, 120-G, 120-B may exist for each inorganic light-emitting device 120-R, 120-G, 120-B.

Each inorganic light-emitting device 120-R, 120-G, 120-B may respectively be mounted or arranged on the driving circuit layer 110 so as to be electronically connected with the corresponding first driving circuit 110-1.

For example, the R inorganic light-emitting device 120-R may be mounted or arranged on the driving circuit layer 110 such that the anode electrode and the cathode electrode are respectively connected to the anode electrode and the cathode electrode of the first driving circuit 110-1, and this is the same for the G inorganic light-emitting device 120-G and the B inorganic light-emitting device 120-B.

Meanwhile, any one of the anode electrode and the cathode electrode of the first driving circuit 110-1 formed on the driving circuit layer 110 may be implemented as a common electrode.

In FIG. 3A, an example wherein the inorganic light-emitting devices 120-R, 120-G, 120-B are micro LEDs of a flip chip type is illustrated. However, the disclosure is not limited thereto, and the inorganic light-emitting devices may be micro LEDs of a lateral type or a vertical type depending on embodiments.

Figure 3B:
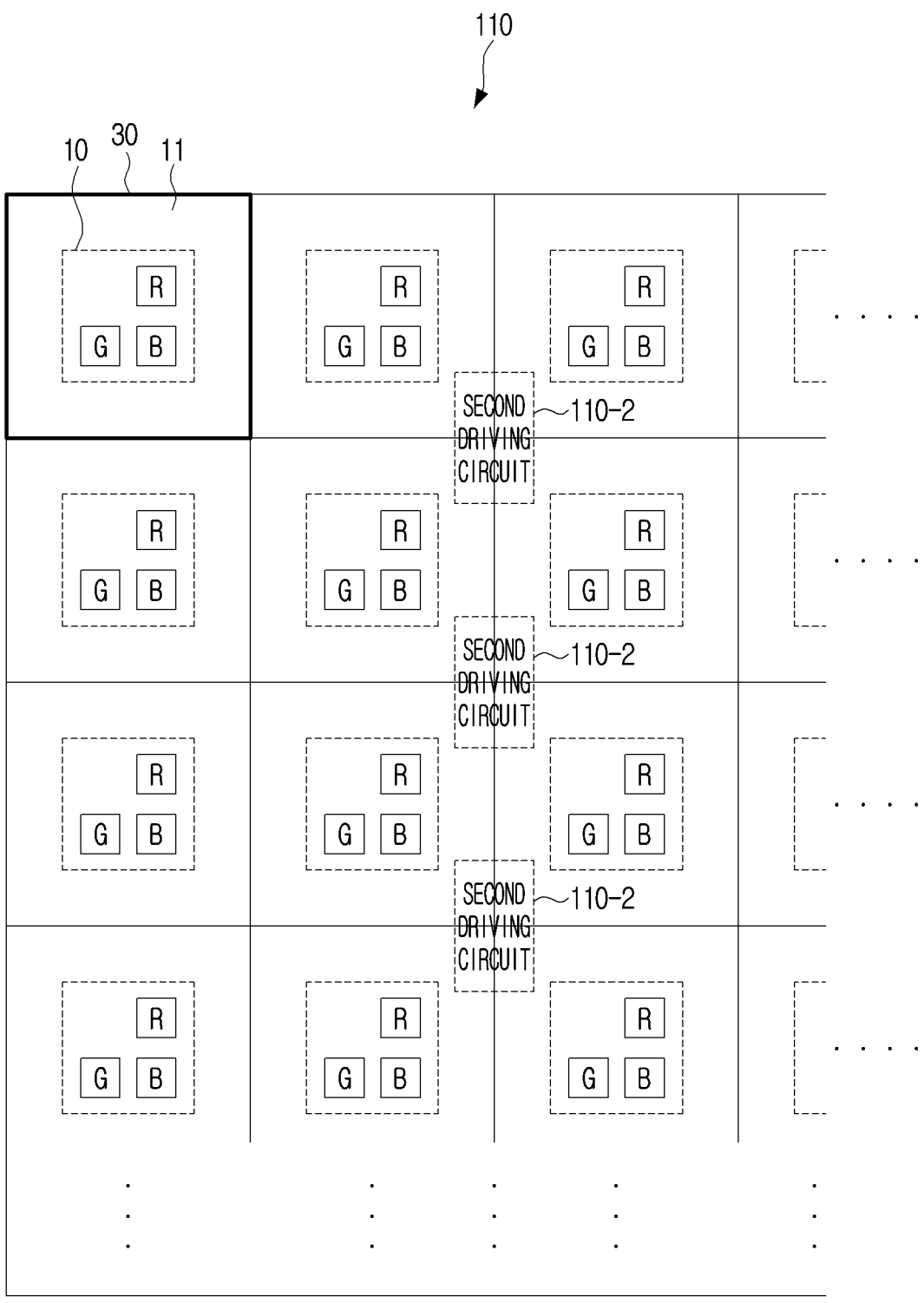
FIG. 3B is a plan view of a driving circuit layer according to an embodiment of the disclosure.

FIG. 3B is a plan view of the driving circuit layer 110 according to an embodiment of the disclosure. Specifically, FIG. 3B illustrates an example wherein the first driving circuit 110-1 and the second driving circuit 110-2 are arranged on the driving circuit layer 110 of the display module 100.

Referring to FIG. 3B, it can be seen that the entire pixel area 30 corresponding to one pixel in the driving circuit layer 110 includes an area 10 wherein three first driving circuits 110-1 for driving each of the R, G, and B sub-pixels are arranged and surrounding remaining areas 11.

Here, the size of the area 10 occupied by the first driving circuits 110-1 for each of the R, G, and B sub-pixels may be a size about ¼ of the entire pixel area 30, but is not limited thereto.

As described above, in one entire pixel area 30, the remaining areas 11 exist, and this is the same for the other pixels. As can be seen above, a lot of spaces exist in the driving circuit layer 110 other than the area occupied by the first driving circuits 110-1, and accordingly, in the remaining areas 11 of the driving circuit layer 110, the second driving circuits 110-2 may be implemented as illustrated in FIG. 3B.

As described above, the second driving circuit 110-2 provides a control signal for driving the pixels of the pixel array in the units of the row lines, and thus a corresponding second driving circuit 110-2 may be provided for each row line, as illustrated in FIG. 3B. However, the locations, the sizes, or the number of the second driving circuits 110-2 illustrated in FIG. 3B are merely an example, and embodiments are not limited to what is illustrated.

Meanwhile, according to an embodiment of the disclosure, in the remaining areas 11 of the driving circuit layer 110, various kinds of circuits for driving the first driving circuit 110-1 may be further included other than the second driving circuit 110-2.

Here, the various kinds of circuits may include a source driver circuit (or a data driver circuit) for providing a data voltage (e.g., a PAM data voltage or a PWM data voltage) to each pixel (or each sub-pixel) of the pixel array arranged in a matrix form.

Also, the various kinds of circuits may include a MUX circuit for selecting each of the plurality of sub-pixels 20-1 to 20-3 constituting the pixel 10.

In addition, the various kinds of circuits may include a driving voltage providing circuit for providing various kinds of driving voltages to each first driving circuit 110-1 included in the display module 100.

Further, the various kinds of circuits may include a clock signal providing circuit providing various kinds of clock signals for driving the gate driver or data driver circuit, and may include a sweep voltage providing circuit for providing a sweep voltage (e.g., a voltage that linearly changes between two different voltages according to time) necessary for driving the PWM circuit.

Here, all of the aforementioned various kinds of circuits do not have to be included in the driving circuit layer 110. That is, at least some of the aforementioned various kinds of circuits may be formed on the driving circuit layer 110 together with the first driving circuits 110-1 and the second driving circuits 110-2, and may be connected with the first driving circuits 110-1.

Alternatively, at least some of the aforementioned various kinds of circuits may be implemented in the form of a separate chip and mounted on an external printed circuit board (PCB) together with a timing controller (TCON), and may be connected with the first driving circuits 110-1 formed on the TFT layer of the display module 100 through a film on glass (FOG) wiring.

Alternatively, at least some of the aforementioned various kinds of circuits may be implemented in the form of a separate chip and arranged on the film in the form of a chip on film (COF), and may be connected with the first driving circuits 110-1 formed on the TFT layer of the display module 100 through a film on glass (FOG) wiring.

Alternatively, at least some of the aforementioned various kinds of circuits may be implemented in the form of a separate chip and arranged in the form of a chip on glass (COG) (i.e., arranged on the rear surface of the glass substrate (the opposite surface of the surface on which the TFT layer is formed based on the glass substrate) of the display module 100), and may be connected with the first driving circuits 110-1 formed on the TFT layer of the display module 100 through a connecting wiring.

For example, among the aforementioned various kinds of circuits, the sweep voltage providing circuit and the MUX circuit may be formed on the driving circuit layer 110, the data driver circuit may be arranged on the rear surface of the glass substrate of the display module 100, and the driving voltage providing circuit, the clock signal providing circuit, and the timing controller (TCON) may be arranged on an external printed circuit board (PCB), but the disclosure is not limited thereto.

Figure 4:
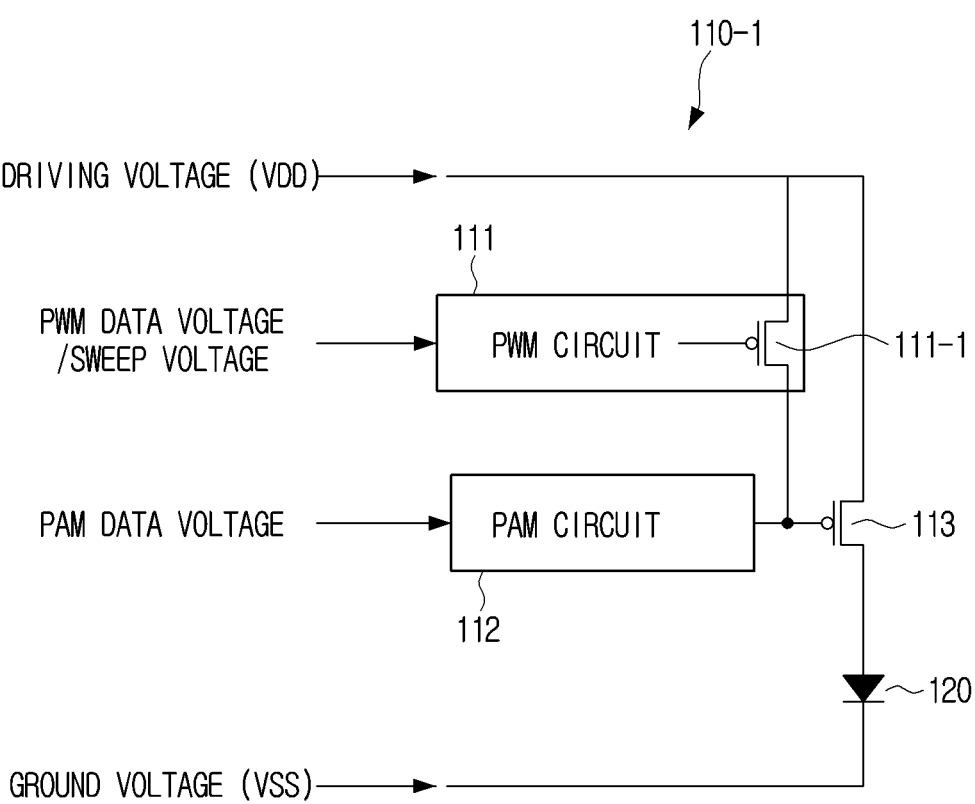
FIG. 4 is a diagram for illustrating an operation of a first driving circuit according to an embodiment of the disclosure.

FIG. 4 is a diagram for illustrating an operation of the first driving circuit 110-

1 according to an embodiment of the disclosure. In FIG. 4, for the convenience of explanation, only one inorganic light-emitting device 120 and one first driving circuit 110-1 for driving the inorganic light-emitting device 120 are illustrated.

The PAM circuit 112 may control the magnitude of the driving current provided to the inorganic light-emitting device 120 based on an applied PAM data voltage, and the PWM circuit 111 may control the driving time (or the pulse width) of the driving current provided to the inorganic light-emitting device 120 based on an applied PWM data voltage.

Specifically, the PAM circuit 112 provides a driving current having the magnitude corresponding to a PAM data voltage to the inorganic light-emitting device 120. Here, the PWM circuit 111 controls the maintenance time of the driving current that the PAM circuit 112 provides to the inorganic light-emitting device 120 (i.e., the driving current having the magnitude corresponding to the PAM data voltage) based on a PWM data voltage, and thereby controls the pulse width of the driving current.

Meanwhile, according to an embodiment of the disclosure, the same PAM data voltage may be applied to each PAM circuit 112 of all sub-pixels of the display module 100, and in this case, the PAM circuit 112 performs a role of a constant current source together with the transistor 113.

That is, the PAM pixel circuits 112 of all sub-pixels provide driving currents of the same magnitude to the inorganic light-emitting device 120, and through the operation of the PWM circuit 111, a gray scale of an image is expressed.

The inorganic light-emitting device 120 may emit light in different luminance according to the pulse width of the driving current provided by the PWM circuit 111. Here, the pulse width of the driving current may also be expressed as a duty ratio of the driving current or a duration of the driving current.

Specifically, referring to FIG. 4, in a state wherein a PAM data voltage is set to the PAM circuit 112 and a PWM data voltage is set to the gate terminal of the driving transistor 111-1 of the PWM circuit 111, if a driving voltage VDD is applied to the anode terminal of the inorganic light-emitting device 120, the PAM circuit 112 provides a driving current of the magnitude corresponding to the PAM data voltage to the inorganic light-emitting device 120, and the inorganic light-emitting device 120 starts to emit light.

Meanwhile, when the driving voltage VDD is applied to the anode terminal of the inorganic light-emitting device 120, a sweep voltage starts to be applied to the PWM circuit 111. When the sweep voltage is applied, the voltage of the gate terminal of the driving transistor 111-1 changes according to the change of the sweep voltage from the voltage based on the PWM data voltage.

When the voltage between the source terminal and the gate terminal of the driving transistor 111-1 reaches the threshold voltage of the driving transistor 111-1 as the voltage of the gate terminal changes according to the sweep voltage, the driving transistor 111-1 is turned on, and accordingly, the driving voltage VDD applied to the source terminal of the driving transistor 111-1 is applied to the gate terminal of the transistor 113 through the drain terminal.

As the driving voltage VDD is applied to the source terminal of the transistor 113, if the driving voltage VDD is applied to the gate terminal of the transistor 113, the voltage between the gate terminal and the source terminal of the transistor 113 exceeds the threshold voltage of the transistor 113, and the transistor 113 is turned off (for reference, in the case of the PMOSFET, the threshold voltage has a negative value, and the PMOSFET is turned on when a voltage smaller than or equal to the threshold voltage is applied between the gate terminal and the source terminal, and is turned off when a voltage exceeding the threshold voltage is applied).

When the transistor 113 is turned off, the driving current cannot flow in the inorganic light-emitting device 120 anymore, and the inorganic light-emitting device 120 stops emitting light.

As the same sweep voltage is applied to all PWM circuits 111 of the display module 100, when it is assumed that the threshold voltages of the driving transistors 111-1 are the same (in actuality, there is a difference among the threshold voltages of the driving transistors 111-1, but the difference can be compensated), the pulse width of the driving current is subordinate only to the PWM data voltage, theoretically.

As described above, the PWM circuit 111 may perform PWM driving of the inorganic light-emitting device 120 by controlling the duration of the driving current.

The structure of the first driving circuit 110-1 illustrated in FIG. 4 is merely an example, and the structure of the circuit is not limited thereto. Also, in FIG. 4, an example wherein the driving transistor 111-1 and the transistor 113 are PMOSFETs is suggested, but they can obviously be implemented as NMOSFETs depending on embodiments.

Figure 5A:
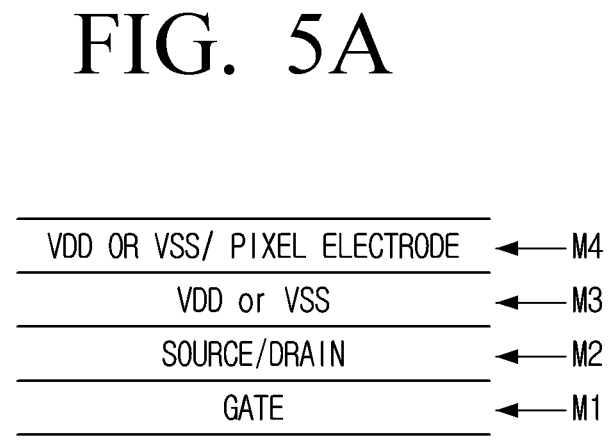

FIG. 5A is a diagram illustrating a stack structure of a metal layer according to an embodiment of the disclosure. According to an embodiment of the disclosure, the driving circuit layer 110 of the display module 100 may have a stack structure including a plurality of metal layers.

Referring to FIG. 5A, on the first metal layer M1 and the second metal layer M2, transistors included in the aforementioned circuits that may be included in the driving circuit layer 110 may be formed.

Specifically, on the first metal layer M1, gate electrodes of the transistors may be formed, and on the second metal layer M2, data electrodes (i.e., source electrodes and drain electrodes) of the transistors may be formed.

Meanwhile, according to an embodiment of the disclosure, the driving circuit layer 110 may further include a third metal layer M3 and a fourth metal layer M4, as illustrated in FIG. 5A.

On the third metal layer M3 and the fourth metal layer M4, electrodes for providing operation power to various kinds of circuits constituting the transistors included in the first and second metal layers M1, M2 may be formed.

Specifically, the third metal layer M3 may include an electrode for providing a driving voltage VDD, and the fourth metal layer M4 may include an electrode for providing a ground voltage VSS.

Alternatively, on the contrary, the third metal layer M3 may include an electrode for providing a ground voltage VSS, and the fourth metal layer M4 may include an electrode for providing a driving voltage VDD.

Meanwhile, on the fourth metal layer M4, an electrode for electronically connecting the first driving circuit 110-1 and the inorganic light-emitting device 120, i.e., a pixel electrode may be formed.

Meanwhile, the material constituting the first to fourth metal layers M1 to M4 may be conductive metal, but is not limited thereto, and any metal material that is used for making a TFT of a stacked structure may fall under a material constituting the first to fourth metal layers M1 to M4. As a detailed content in this regard will be irrelevant to the gist of the disclosure, more detailed explanation in this regard will be omitted.

Figure 5B:
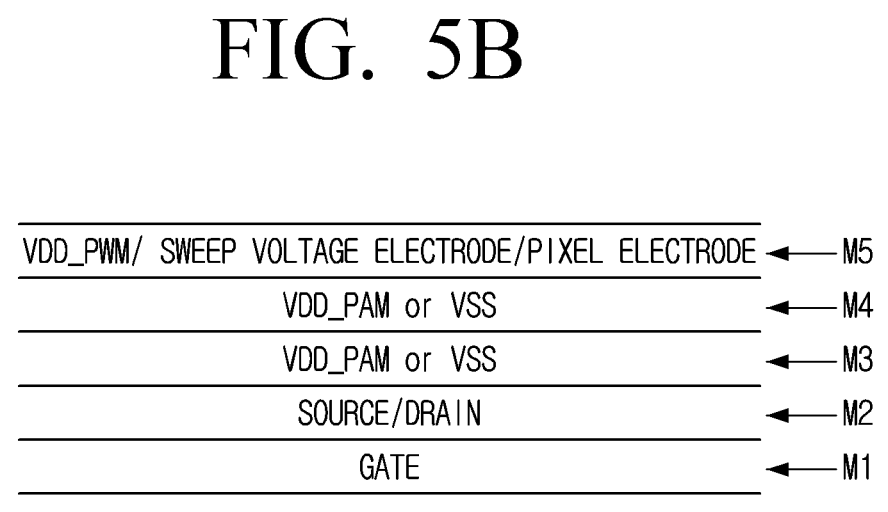

FIG. 5B is a diagram illustrating a stack structure of a metal layer according to another embodiment of the disclosure. When the structure of the metal layer illustrated in FIG. 5B is compared with the structure of the metal layer illustrated in FIG. 5A, the metal layer in FIG. 5B further includes the fifth metal layer M5.

In the actual display module 100, there is a difference in resistance values for each area. Accordingly, when a driving current flows, a difference occurs in IR drop values for each area, and due to this, a difference in a driving voltage VDD occurs according to the location of the display module 100.

Accordingly, if the PWM circuit 111 and the PAM circuit 112 commonly use the driving voltage VDD, a problem that a time point of operation of the PWM circuit 111 varies for each area with respect to the same PWM data voltage occurs. This is because, as the driving voltage VDD is applied to the source terminal of the driving transistor 111-1, when referring to FIG. 4, the on/off operations of the driving transistor 111-1 are influenced by a change of the driving voltage.

Such a problem can be resolved by applying separate driving voltages to each of the PAM circuit 112 and the PWM circuit 111, such as applying the first driving voltage VDD_PAM to the PAM circuit 112, and applying the second driving voltage VDD_PWM to the PWM circuit 111.

The fifth metal layer M5 in FIG. 5B may be used for forming an electrode for providing one of the two driving voltages VDD_PAM, VDD_PWM as above to the first driving circuit 110-1. Also, the fifth metal layer M5 may be used for forming an electrode for providing the aforementioned sweep voltage to the first driving circuit 110-1.

However, embodiments are not limited thereto, and it is obvious that in an embodiment as in FIG. 5A, the first driving voltage (VDD_PAM) electrode, the second driving voltage (VDD_PWM) electrode, and the sweep voltage electrode can be appropriately divided and arranged on the third metal layer M3 or the fourth metal layer M4.

Specifically, according to FIG. 5B, on the first metal layer M1, gate electrodes of the transistors may be formed, and on the second metal layer M2, data electrodes (i.e., source electrodes and drain electrodes) of the transistors may be formed.

Also, each of the third metal layer M3 and the fourth metal layer M4 may include an electrode for providing the first driving voltage VDD_PAM or the ground voltage VSS.

Meanwhile, on the fifth metal layer M5, an electrode for providing the second driving voltage VDD_PWM, an electrode for providing a sweep voltage, and a pixel electrode may be formed.

However, what is illustrated in FIG. 5B is merely an example, and the disclosure is not limited thereto. That is, respective electrodes for providing the first driving voltage VDD_PAM, the second driving voltage VDD_PWM, the ground voltage VSS, and the sweep voltage may be formed while being divided on the third to fifth metal layers M3 to M5 in a different manner from what is illustrated in FIG. 5B.

Meanwhile, as illustrated in FIG. 5B, in case the second driving voltage (VDD_PWM) electrode and the sweep voltage electrode are formed on the fifth metal layer M5, the resistance of the second driving voltage (VDD_PWM) electrode is reduced, and thus there are effects that the gamma uniformity of the display module 100 is improved, and the RC delay of the sweep voltage is reduced.

Figure 6A:
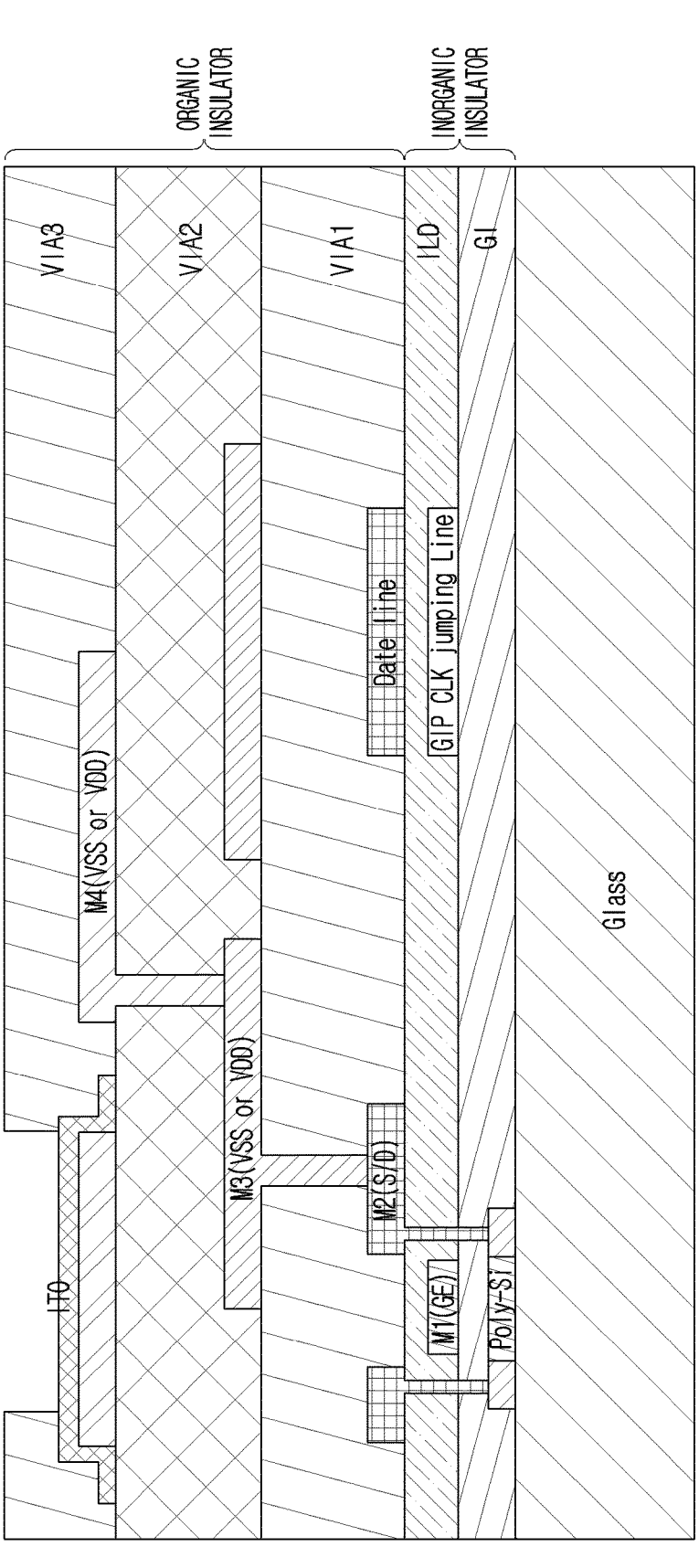
FIG. 6A is a diagram illustrating in detail a stack structure of a driving circuit layer according to an embodiment of the disclosure.

FIG. 6A is a diagram illustrating in detail a stack structure of the driving circuit layer 110 according to an embodiment of the disclosure.

Referring to FIG. 6A, as described above in FIG. 5A, it can be seen that the aforementioned first to fourth metal layers M1 to M4 are formed on the glass.

Specifically, on the glass substrate 30, a semiconductor channel layer Poly-Si may be formed. However, the type of the semiconductor channel layer illustrated is merely an example, and the semiconductor channel layer may be formed of various materials such as Amorphous Silicon (a-Si) or an oxide, etc. depending on embodiments.

On the channel layer, the first metal layer M1 including a gate electrode (GE) of the transistor is formed, and the channel layer is opened or closed according to a voltage applied to the gate electrode. Accordingly, the flow of data is controlled between the source and drain electrodes (S/D) formed on the second metal layer M2.

It can be seen that on the third metal layer M3 and the fourth metal layer M4, the driving voltage (VDD) electrode or the ground voltage (VSS) electrode is respectively formed, and on the fourth metal layer M4, the pixel electrode ITO is formed.

Meanwhile, between the semiconductor channel layer and the first metal layer M1, a gate insulator (GI) is formed, and between the first metal layer M1 and the second metal layer M2, an inter layer dielectrics (ILD) is formed. Here, the gate insulator and the inter layer dielectrics are inorganic insulators.

Also, between the second metal layer M2 and the third metal layer M3, between the third metal layer M3 and the fourth metal layer M4, and on the fourth metal layer M4, organic insulators are respectively formed.

Here, it can be seen that the thickness of the organic insulators is formed to be bigger than the thickness of the inorganic insulators.

Meanwhile, referring to FIG. 6A, it can be seen that a GIP CLK jumping line is formed on the first metal layer M1. Explanation in this regard will be described later.

Figure 6B:
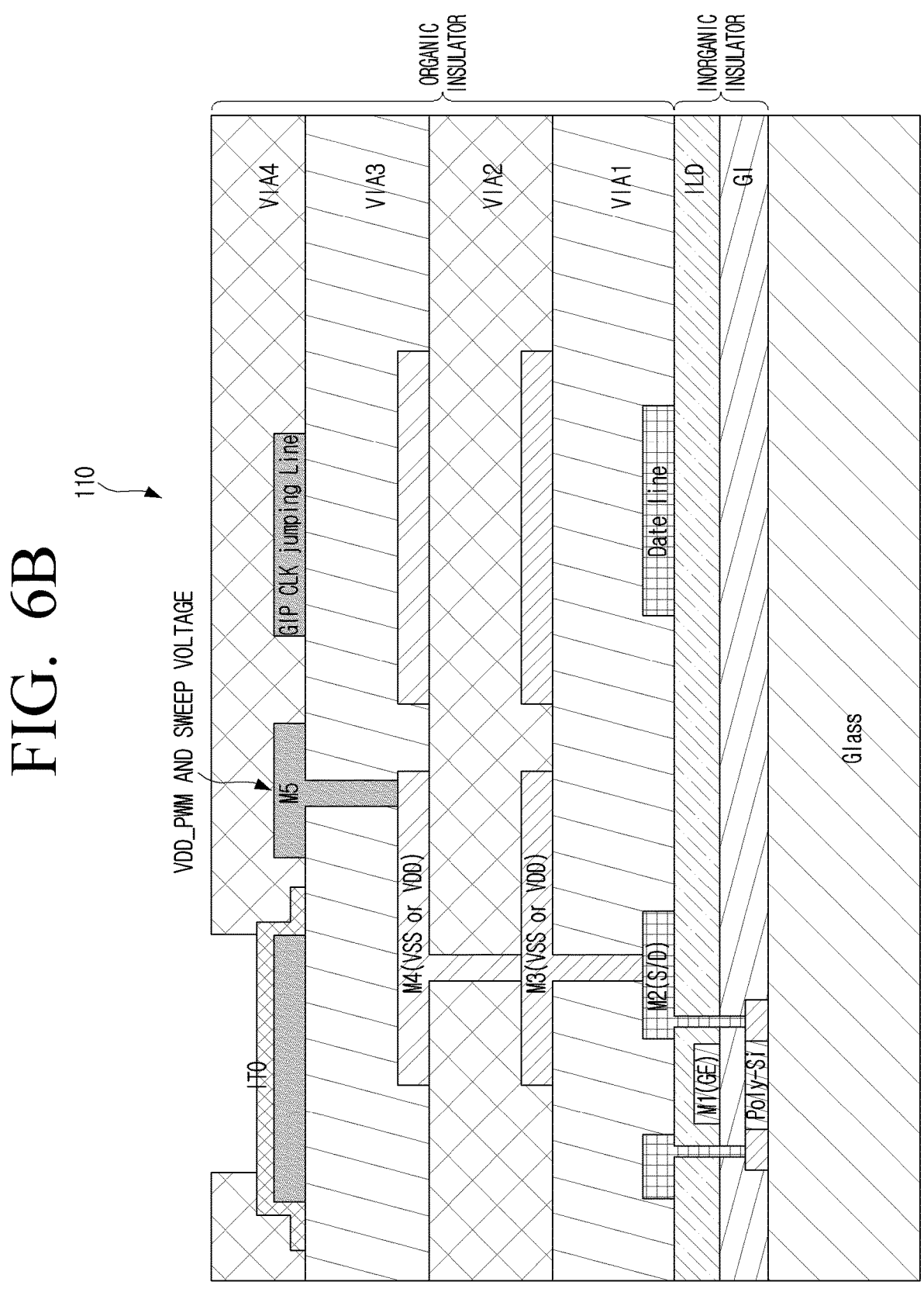
FIG. 6B is a diagram illustrating in detail a stack structure of a driving circuit layer 110 according to another embodiment of the disclosure.

FIG. 6B is a diagram illustrating in detail a stack structure of the driving circuit layer 110 according to another embodiment of the disclosure. In explaining FIG. 6B, regarding a content that overlaps with what is described above in FIG. 6A, explanation will be omitted.

Referring to FIG. 6B, it can be seen that the aforementioned first to fifth metal layers M1 to M5 are formed on the glass, as described above in FIG. 5B.

On the third metal layer M3 and the fourth metal layer M4, the first driving voltage (VDD_PAM) electrode or the ground voltage (VSS) electrode is respectively formed.

It can be seen that on the fifth metal layer M5, the second driving voltage (VDD_PWM) electrode, the sweep voltage electrode, and the pixel electrode (ITO) are respectively formed.

Meanwhile, between the semiconductor channel layer and the first metal layer M1, a gate insulator (GI) is formed, and between the first metal layer M1 and the second metal layer M2, an inter layer dielectrics (ILD) is formed, respectively, and the gate insulator and the inter layer dielectrics are inorganic insulators.

Also, between the second metal layer M2 and the third metal layer M3, between the third metal layer M3 and the fourth metal layer M4, between the fourth metal layer M4 and the fifth metal layer M5, and on the fifth metal layer M5, organic insulators are respectively formed.

In this case, the thickness of the organic insulators is also formed to be bigger than the thickness of the inorganic insulators.

Meanwhile, referring to FIG. 6B, it can be seen that a GIP CLK jumping line is formed on the fifth metal layer M5. Explanation in this regard will be described later.

Figure 7:
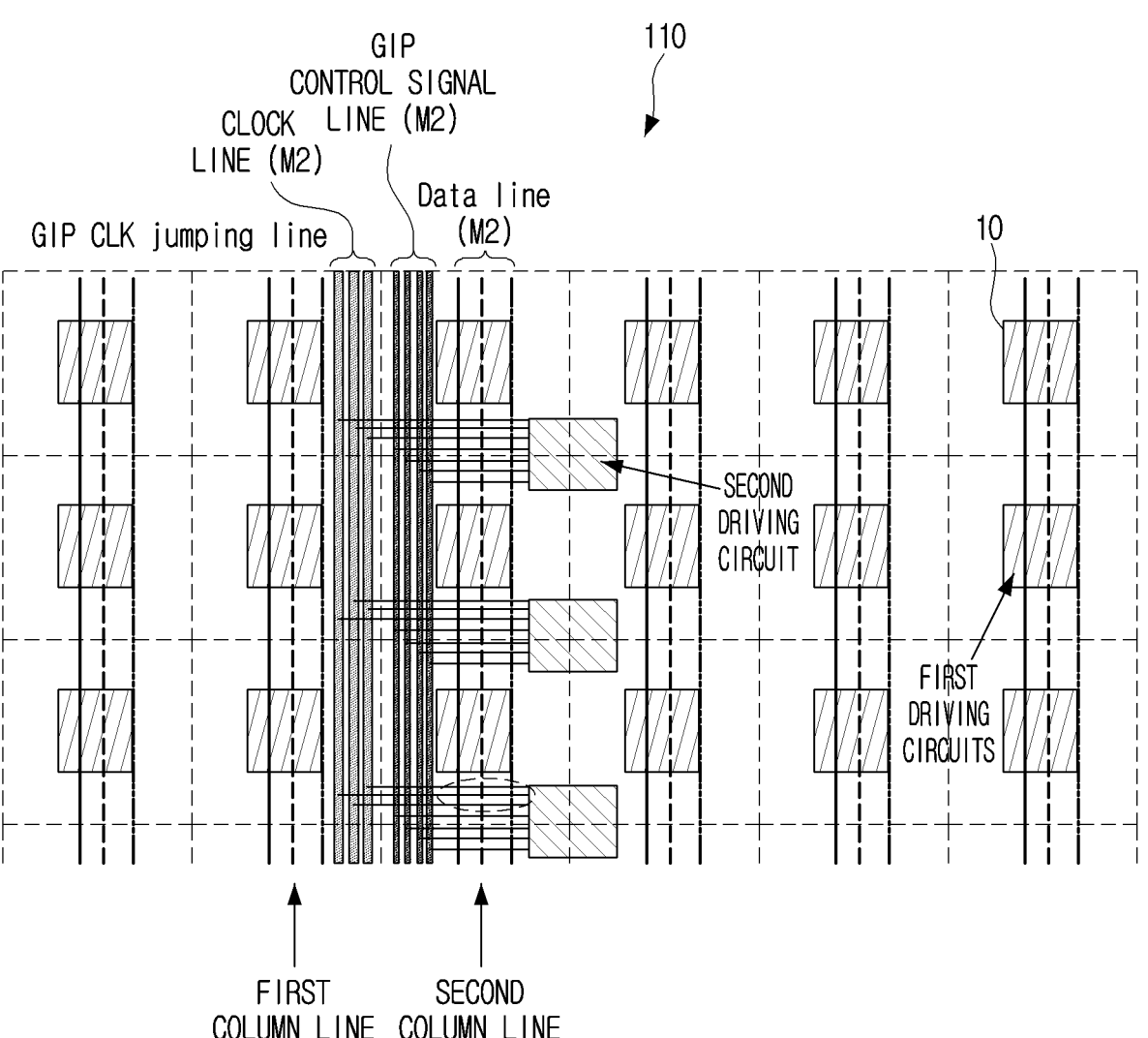
FIG. 7 is a plan view of a driving circuit layer according to an embodiment of the disclosure.

FIG. 7 is a plan view of the driving circuit layer 110 according to an embodiment of the disclosure. According to FIG. 7, it can be seen that on the driving circuit layer 110, the areas 10 corresponding to each pixel of the pixel array wherein each pixel is arranged in a matrix form are arranged in a matrix form at specific intervals from one another. Here, in the respective areas 10, the first driving circuits 110-1 corresponding to each of the plurality of sub-pixels (e.g., the R, G, B sub-pixels) are arranged.

Also, on the driving circuit layer 110, data lines are arranged in each column line, for providing data voltages respectively to the first driving circuits corresponding to the respective column lines in the matrix form.

Meanwhile, referring to FIG. 7, it can be seen that on the driving circuit layer 110, clock lines and GIP control signal lines are arranged in an area between the first driving circuits corresponding to the first column line in the matrix form, and the first driving circuits corresponding to the second column line adjacent to the first column line in the direction of the data line.

Here, the clock line is a line to which a plurality of clock signals input into the second driving circuit 110-2 are applied, and the GIP control signal line is a line to which a control signal (e.g., a reset signal, a start signal, etc.) for controlling the operation of the second driving circuit 110-2 is applied.

Also, referring to FIG. 7, it can be seen that the second driving circuits 110-2 are arranged in an area opposite to the area wherein the clock lines are arranged, based on the first driving circuits 110-1 corresponding to the second column line.

However, this is merely an example, and the second driving circuits 110-2 may also be arranged in an area opposite to the area wherein the clock lines are arranged, based on the first driving circuits 110-1 corresponding to the first column line.

Here, all of the clock lines and the GIP control signal lines, and the data lines are formed on the second metal layer M2.

Accordingly, a clock signal and a GIP control signal cannot be input into the second driving circuit 110-2 through the second metal layer M2, and thus the second driving circuit 110-2 receives input of a clock signal and a GIP control signal through a different metal layer which is not the second metal layer M2.

Here, a line formed on a different metal layer for applying a clock signal and a GIP control signal to the second driving circuit 110-2 becomes the GIP clock jumping line.

Accordingly, in the various embodiments of the disclosure, a clock signal and a GIP control signal are applied to the second driving circuit 110-2 through a different metal layer which is not the second metal layer M2 wherein data lines, clock lines, and GIP control signal lines are formed.

FIG. 6A illustrates an embodiment wherein a GIP clock jumping line is formed on the first metal layer M1, and FIG. 6B illustrates an embodiment wherein a GIP clock jumping line is formed on the fifth metal layer M5, respectively.

Figure 8:
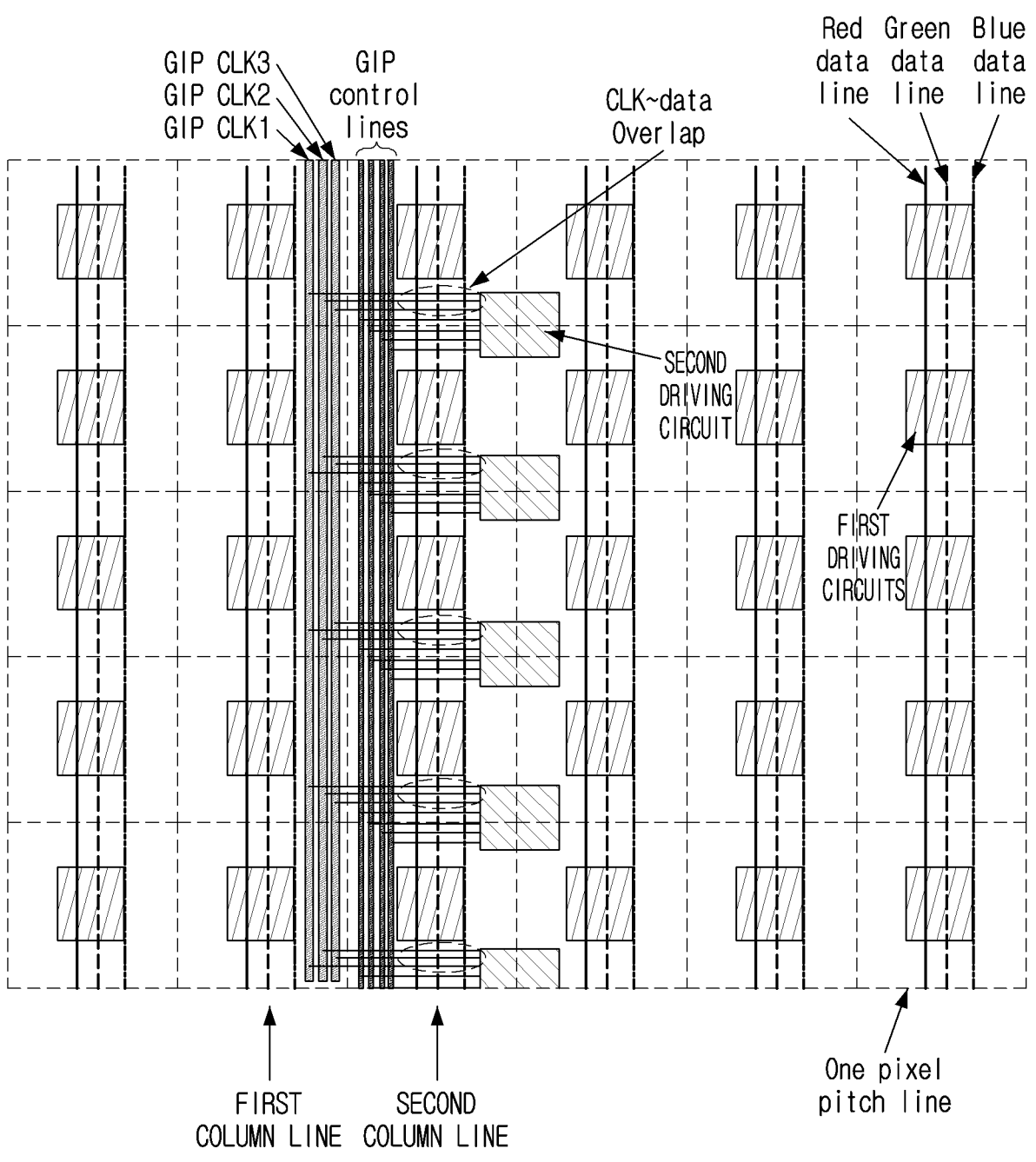
FIG. 8 is a diagram for illustrating a problem that may occur as a GIP clock jumping line overlaps with a data line, and a solution therefor.

FIG. 8 is a diagram for illustrating a problem that may occur as a GIP clock jumping line overlaps with a data line, and a solution therefor according to an embodiment of the disclosure.

As described above in FIG. 7, a clock signal and a GIP control signal can obviously be applied to the second driving circuit 110-2 through a GIP clock jumping line formed on a different metal layer which is not the second metal layer M2 wherein data lines are formed. Also, when viewed on a plan view, it can be seen that data lines and GIP clock jumping lines corresponding to the second column line overlap, as illustrated in FIG. 8.

Accordingly, a clock signal applied through a GIP clock jumping line is coupled to a data line, and a changed data voltage which is not the desired data voltage is set to the first driving circuits 110-1 corresponding to the second column line. This causes an undesired mura to pixels corresponding to the second column line when the display module 100 is driven.

Here, the amount of clock signals coupled to the data line varies according to the size of a parasitic capacitance between the data line and the GIP clock jumping line.

Specifically, as a parasitic capacitance is bigger, the coupling effect becomes bigger. Thus, a mura can be removed by reducing a parasitic capacitance value between the GIP clock jumping line and the data line.

Referring to FIG. 6A, it can be seen that a GIP clock jumping line is formed on the first metal layer M1. However, in this case, the thickness of an inorganic insulator is thinner than the thickness of an organic insulator, as described above. Thus, a parasitic capacitance value between the GIP clock jumping line and the data line becomes bigger than a case of forming a GIP clock jumping line on the third metal layer M3 or the fourth metal layer M4.

Accordingly, according to an embodiment of the disclosure, a GIP clock jumping line may be formed on the third metal layer M3 or the fourth metal layer M4, unlike what is illustrated in FIG. 6A. In this case, a parasitic capacitance value between the GIP clock jumping line and the data line becomes smaller than a case of forming a GIP clock jumping line on the first metal layer M1, and thus the coupling effect is reduced. Accordingly, the aforementioned undesired mura that occurs in pixels corresponding to the second column line may be reduced or removed.

Meanwhile, in the embodiment of FIG. 6B, a GIP clock jumping line is formed on the fifth metal layer M5. Accordingly, in the embodiment illustrated in FIG. 6B, the aforementioned parasitic capacitance value can be reduced drastically compared to a case of forming a GIP clock jumping line on the first metal layer M1, and the aforementioned mura can further be removed.

In particular, in the embodiment of FIG. 6B, electrodes to which the first driving voltage VDD_PAM and the ground voltage VSS which are DC voltages are applied are arranged on the third and fourth metal layers M3, M4 between the GIP clock jumping line and the data line. As such electrodes arranged on the third and fourth metal layers M3, M4 have an effect of shielding voltage coupling, a phenomenon wherein a clock signal applied through the GIP clock jumping line is coupled to the data line can be further prevented.

According to the various embodiments of the disclosure as described above, a bezel-less display module can be provided. Also, design of an optimized driving circuit is possible, and inorganic light-emitting devices can be driven stably. In addition, a display module having improved color reproducibility can be provided. Further, the disclosure can contribute to miniaturization and weight lightening of a display panel.

Also, in the aforementioned various embodiments of the disclosure, a TFT constituting a TFT layer (or a TFT panel) is not limited to a specific structure or type. That is, a TFT cited in the various embodiments of the disclosure may be implemented as a low temperature poly silicon (LTPS) TFT, an oxide TFT, a silicon (poly silicon or a-silicon) TFT, an organic TFT, a graphene TFT, etc., and also, only a P type (or an N-type) MOSFET may be formed in an Si wafer CMOS process and applied.

The descriptions above are merely exemplary explanation of the technical idea of the disclosure, and various amendments and modifications may be made by those having ordinary skill in the technical field to which the disclosure belongs, within the scope of the intrinsic characteristics of the disclosure. Also, the embodiments according to the disclosure are not for limiting the technical idea of the disclosure, but for explaining the technical idea, and the scope of the technical idea of the disclosure is not limited by the embodiments. Accordingly, the scope of protection of the disclosure should be interpreted based on the appended claims, and all technical ideas within an equivalent scope thereto should be interpreted to belong to the scope of protection of the disclosure.

What is claimed is:

1. A display module comprising:

a substrate;

a driving circuit layer formed on the substrate, the driving circuit layer comprising first driving circuits and second driving circuits; and a pixel array, comprising a plurality of pixels, formed on the driving circuit layer, each pixel including a plurality of inorganic light-emitting devices, the plurality of pixels being arranged in a matrix form, wherein a first driving circuit from among the first driving circuits is provided for each pixel, and the first driving circuits drive the plurality of inorganic light-emitting devices included in each pixel based on data voltages applied through data lines, wherein the second driving circuits generate control signals for driving the first driving circuits based on clock signals applied through clock lines, and provide the generated control signals to the first driving circuits, wherein the first driving circuits and the second driving circuits comprise a plurality of thin film transistors (TFTs), and wherein the driving circuit layer comprises:

a first metal layer at which gate electrodes of the plurality of TFTs are formed;

a second metal layer at which source electrodes and drain electrodes of the plurality of TFTs, the clock lines, and the data lines are formed;

an inter-layer dielectric formed between the first metal layer and the second metal layer; and at least one third metal layer at which electrodes that provide a voltage for driving the first driving circuits are formed, wherein the clock signals are applied from the clock lines to the second driving circuits through jumping lines formed in the at least one third metal layer, wherein the voltage for driving the first driving circuits is a driving voltage or a ground voltage, and wherein the clock lines are arranged in a column direction, and the first driving circuits are between the clock lines and the second driving circuits in a horizontal direction.

2. The display module of claim 1, wherein the plurality of pixels of the pixel array are arranged in the matrix form at predetermined intervals from one another, wherein the first driving circuits are respectively formed in areas corresponding to the plurality of respective pixels, wherein the clock lines are arranged in a direction of the data lines in an area between the first driving circuits corresponding to a first column line in the matrix form and the first driving circuits corresponding to a second column line adjacent to the first column line, and wherein the data lines are arranged in an area between the clock lines and the second driving circuits.

3. The display module of claim 2, wherein the second driving circuits provide the control signals to the first driving circuits for driving the plurality of inorganic light-emitting devices corresponding to row lines in the matrix form.

4. The display module of claim 1, wherein the driving circuit layer has a stack structure in an order of the first metal layer, the second metal layer, and the at least one third metal layer.

5. The display module of claim 4, wherein the jumping lines are formed in one of two third metal layers, and wherein on one of the two third metal layers, an electrode for providing the driving voltage is formed, and on the other one of the two third metal layers, an electrode for providing the ground voltage is formed.

6. The display module of claim 4, wherein the driving voltage is one of a first driving voltage and a second driving voltage, wherein the jumping lines are formed in one of three third metal layers, and wherein on a first of the three third metal layers, an electrode for providing the first driving voltage is formed, and on a second of the three third metal layers, an electrode for providing the second driving voltage is formed, and on a third of the three third metal layers, an electrode for providing the ground voltage is formed.

7. The display module of claim 6, wherein the first driving circuits respectively comprise a pulse width modulation (PWM) circuit comprising a driving transistor, wherein the PWM circuit changes a voltage of a gate terminal of the driving transistor according to an applied sweep voltage, and provides a driving current of a pulse width corresponding to a data voltage to the plurality of inorganic light-emitting devices, and one of the three third metal layers further comprises a sweep electrode for applying the sweep voltage.

8. The display module of claim 1, wherein the driving circuit layer further comprises:

an inorganic insulator formed between the first metal layer and the second metal layer; and an organic insulator formed between the second metal layer and the at least one third metal layer; and a thickness of the organic insulator is greater than a thickness of the inorganic insulator.

* * * * *